United States Patent
Abbasfar

(10) Patent No.: US 8,223,042 B2
(45) Date of Patent: Jul. 17, 2012

(54) ENCODING DATA WITH MINIMUM HAMMING WEIGHT VARIATION

(75) Inventor: Aliazam Abbasfar, Sunnyvale, CA (US)

(73) Assignee: Rambus Inc., Sunnyvale, CA (US)

( * ) Notice: Subject to any disclaimer, the term of this patent is extended or adjusted under 35 U.S.C. 154(b) by 80 days.

(21) Appl. No.: 12/922,758

(22) PCT Filed: Mar. 30, 2009

(86) PCT No.: PCT/US2009/038808
§ 371 (c)(1),
(2), (4) Date: Sep. 15, 2010

(87) PCT Pub. No.: WO2009/134568
PCT Pub. Date: Nov. 5, 2009

(65) Prior Publication Data
US 2011/0025533 A1    Feb. 3, 2011

Related U.S. Application Data

(60) Provisional application No. 61/041,734, filed on Apr. 2, 2008.

(51) Int. Cl.
*H03M 7/46* (2006.01)
(52) U.S. Cl. .................. 341/63; 341/58; 341/59
(58) Field of Classification Search .......... 341/58–59, 341/63
See application file for complete search history.

(56) References Cited

U.S. PATENT DOCUMENTS

| | | | |
|---|---|---|---|
| 6,333,704 B1 * | 12/2001 | Jung et al. | 341/58 |
| 6,763,406 B1 | 7/2004 | Devanney et al. | |
| 7,149,955 B1 | 12/2006 | Sutardja et al. | |
| 7,676,725 B1 * | 3/2010 | McAdoo et al. | 714/752 |
| 2001/0024457 A1 | 9/2001 | Barry et al. | |
| 2002/0156953 A1 | 10/2002 | Beiley et al. | |
| 2007/0217312 A1 | 9/2007 | Newcomb et al. | |

OTHER PUBLICATIONS

"512Mbit GDDR4 SGRAM," Revision 1.2, Samsung Electronics, May 2007, pp. 1-70 and especially pp. 53-55.
PCT International Search Report and Written Opinion, PCT/US2009/038808, Feb. 8, 2010, 15 pages.

(Continued)

*Primary Examiner* — Khai M Nguyen
(74) *Attorney, Agent, or Firm* — Fenwick & West LLP

(57) ABSTRACT

M-bit data are encoded into n-bit data such that the encoded n-bit data has a sufficient number of encoded data patterns enough to encode the number ($2^m$) of data patterns in the m-bit data but that the n-bit data has Hamming Weights (HWs) with minimum (smallest possible) variation. Specifically, encoder logic is configured to receive $2^m$ of m-bit data patterns and encode the $2^m$ of m-bit data patterns to n-bit encoded data patterns, n being greater than m and me being a positive integer greater than one. The encoder logic is configured to map the $2^m$ m-bit data patterns to a subset of $2^m$ of the n-bit encoded data patterns, and the n-bit data patterns in said subset has a minimum (smallest possible) range of Hamming Weight variation while the number of the n-bit data patterns in said subset is not less than $2^m$.

26 Claims, 3 Drawing Sheets

OTHER PUBLICATIONS

Mircea R. Stan., et al., "Low-Power Encodings for Global Communication in CMOS VLSI," IEEE Transactions on Very Large Scale Integration (VLSI) Systems, Dec. 1997, vol. 5, No. 4, pp. 444-455.

Mircea R. Stan, et al., "Bus-Invert Coding for Low-Power I/O," IEEE Transactions on Very Large Scale Integration (VLSI) Systems, Mar. 1995, vol. 3, No. 1, pp. 49-58.

Stan, M.R. et al., "Bus-Invert Coding for Low-Power I/O," IEEE Transactions on Very Large Scale Integration (VLSI) Systems, vol. 3, No. 1, Mar. 1995, pp. 49-58. 10 pages.

International Preliminary Report on Patentability and Written Opinion of the International Searching Authority dated Oct. 5, 2010, for International Application No. PCT/US2009/038808. 6 Pages.

* cited by examiner

ENCODING DATA WITH MINIMUM HAMMING WEIGHT VARIATION

The present disclosure relates to encoding data to reduce simultaneous switching output (SSO) noise on a single-ended parallel communication link.

Circuits are often configured to transmit and receive multi-bit data using a single-ended parallel communication link or bus between the circuits. When multiple output drivers on the circuits change state at the same time at a high speed, the changing current drawn from a power supply by the output drivers induces a voltage that results in power supply disturbances commonly referred to as SSO noise (or SSN (Simultaneous Switching Noise)). SSN can cause undesired transient behavior among the output drivers, input receivers or internal logic on the circuits.

Conventional techniques used for reducing SSN on single-ended parallel links include dynamic bus inversion (DBI). DBI inverts the multi-bit data to be transferred over the parallel communication link to reduce SSN. The specific criterion used to invert the multi-bit data depends upon the various implementations of DBI. Some DBI schemes are capable of reducing the total current drawn from a supply voltage to half of that in non-DBI systems. However, such conventional techniques may not reduce SSN and power consumption to a desirable level.

DETAILED DESCRIPTION OF EMBODIMENTS

Embodiments of the present disclosure encode m-bit data into n-bit data such that the encoded n-bit data has a sufficient number of encoded data patterns to encode the number of data patterns in the m-bit data (i.e., up to $2^m$ patterns) but that the n-bit data has Hamming Weights (HWs) with minimum (i.e., smallest possible) variation. Hamming Weight ("HW") in general refers to the number of non-zero symbols in a symbol sequence, and more specifically to the number of ones (1's) in a binary sequence of data bits. In one embodiment, encoder logic is configured to receive $2^m$ of m-bit data patterns and encode the $2^m$ of m-bit data patterns to n-bit encoded data patterns, n being greater than m (where m is a positive integer greater than one). The encoder logic is configured to map up to $2^m$ m-bit data patterns to a subset of $2^n$ n-bit encoded data patterns, and the n-bit data patterns in said subset have a minimum range of HW variation. In one embodiment, the number of the n-bit data patterns in said subset is at least $2^m$.

Reference will now be made to several embodiments of the present disclosure(s), examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles of the disclosure described herein.

Figure 1:
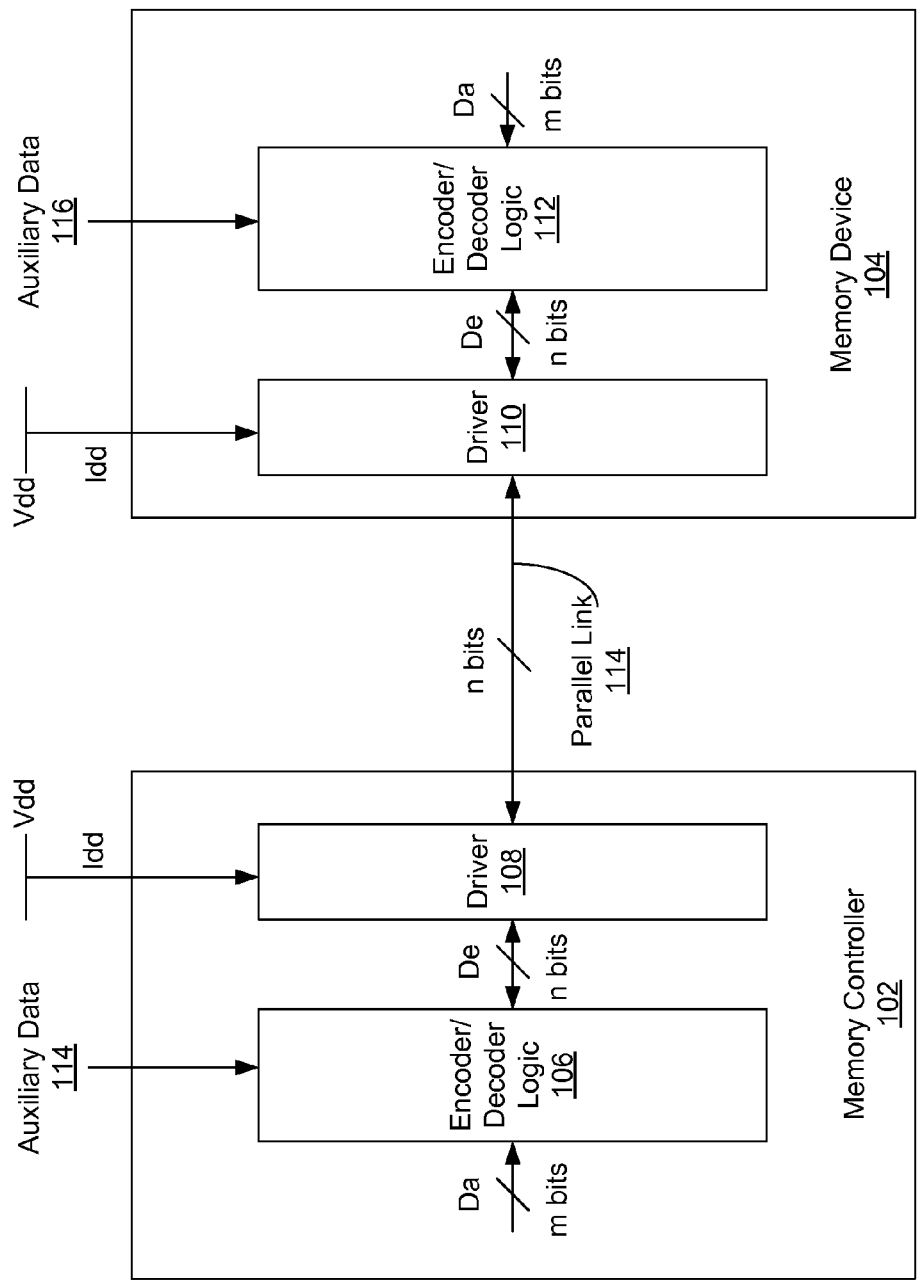
FIG. 1 illustrates a system including an encoder and decoder capable of coding and decoding data according to one embodiment of the present disclosure.

FIG. 1 illustrates a system including an encoder and decoder capable of coding and decoding data according to one embodiment of the present disclosure. The system of FIG. 1 includes two circuits communicating with each other on a single-ended parallel communication link 114. For example, circuit 102 may be a memory controller integrated circuit (IC), and circuit 104 may be a memory device IC such as a DRAM or SRAM. The single-ended parallel communication link 114 may be a bus on a circuit board on which the circuits 102, 104 reside, and has a data width (n bits) larger than the number of bits (m bits) of write data Da, which can be provided to logic 106 as, for example, serial or parallel data. Here, m is a positive integer greater than one (m>1). Although the link 114 is shown herein as a single-ended communication link, note that it can also be a link for transmitting differential signals or multi-wire signals. Memory controller 102 includes encoder/decoder logic 106 and a signal driver 108. Memory device 104 also includes encoder/decoder logic 112 and a signal driver 108.

Encoder/decoder logic 106 includes combinatorial logic gates or look-up tables (LUTs) that are configured to perform encoding of the m-bit data it receives to convert the m-bit data to n-bit data (n>m) encoded according to embodiments of the present disclosure. The m-bit data Da may be received from other parts of the memory controller 102 or memory device 104, such as from state machines (not shown), memory cells (not shown), etc. In addition, encoder/decoder logic 106 may also receive auxiliary data 114, such as commands relating to memory controller 102 or memory device 104, and encode the auxiliary data also according to embodiments of the present disclosure for transmission on parallel communication link 114. For example, the auxiliary data 114 may be a Data Mask (DM) command, which instructs the memory device 104 to ignore the data on the parallel link 114 (i.e., no write operation). In addition, encoder/decoder logic 106 includes combinatorial logic gates or LUTs to decode n-bit data encoded according to embodiments of the present disclosure and received from memory device 104 over parallel communication link 114. In one embodiment, m-bit data Da includes 8 parallel bits and n-bit data De includes 9 parallel bits. Although the operation of encoder/decoder logic 106 and driver 108 in memory controller 102 are explained herein, note that the operation of encoder/decoder logic 112 and driver 110 in memory device 104 are similar and symmetrical to that of encoder/decoder logic 106 and driver 108 in memory controller 102, and a separate explanation is omitted.

The m-bit data Da and n-bit data De have varying HWs depending upon the number of logic level "1"s in the m-bit data or n-bit data. Encoder/decoder logic 106 encodes the m-bit data Da into encoded n-bit data De using a subset of n-bit codes, such that the encoded n-bit data has minimal variation in HWs while still having a sufficient number of encoded data patterns to encode the number of data patterns ($2^m$) in the m-bit data Da. In other words, a subset of the possible n-bit data words is used to encode the $2^m$ m-bit data, so that the subset of the n-bit data patterns has only a limited number (e.g., smallest possible number) of different HWs among all possible HWs in n-bit data words. The optimum subset is chosen to maximize the range of HWs in the n-bit codes used to express the $2^m$ possible patterns of input data Da. The specific encoding logic to use to encode each of the m-bit data patterns depends upon the HW in each of the m-bit data patterns to encode, i.e., the number of logic level "1"s in the m-bit data patterns to encode.

More specifically, any subset of n-bit data words, which can be represented by a codeword set $S=\{C_1, C_2, \ldots, C_p\}$, will have $p \leq 2^n$ codewords, where p is the size of the code word set S. The HW set of the codeword set S is defined by $HW(S)=\{HW(C_1), HW(C_2), \ldots, HW(C_p)\}$, where $HW(C_k)$ is the HW of the code word $C_k$ for $k=1, 2, \ldots, p$. The variation range of Hamming Weights $H(S)$ in the codeword set S is $\max(HW(S))-\min(HW(S))$. The encoding method of the embodiments of the present disclosure selects a subset Q, such that the variation range of the Hamming Weights in the subset Q, i.e., $H(Q)=\max(HW(Q))-\min(HW(Q))$ is minimized, with the size of the subset Q being not less than e.g., $2^m$, which is the number of m-bit data patterns being encoded in the embodiment of FIG. 1. In other embodiments, data Da may express fewer than $2^m$ patterns using m-bit data, but may nevertheless benefit from the encoding schemes described herein.

Figure 2:
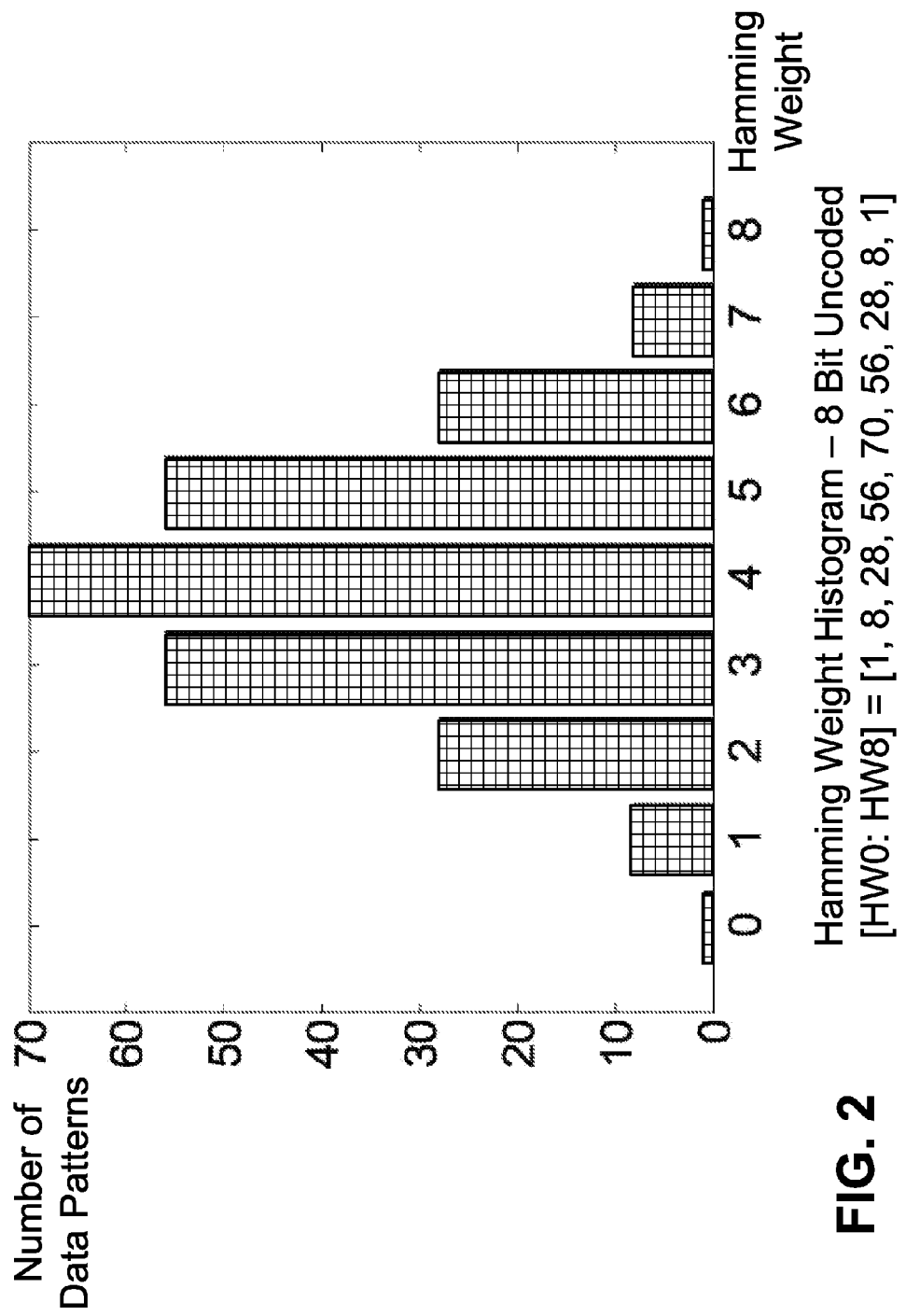
FIG. 2 illustrates Hamming Weights (HWs) present in 8 bit uncoded data.
Figure 3:
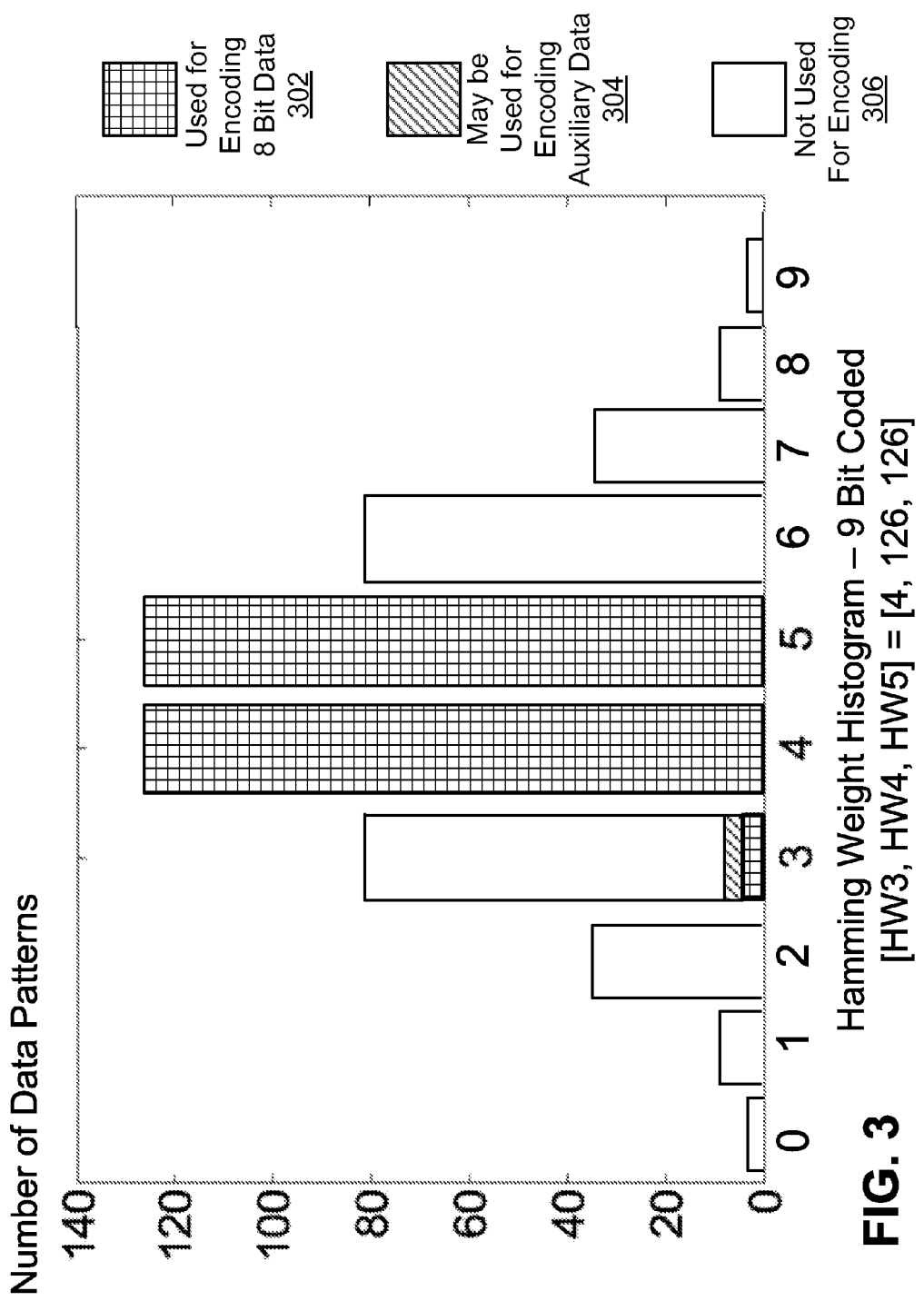
FIG. 3 illustrates HWs present in 9 bit coded data encoded according to one embodiment of the present disclosure.

This is explained in more detail with reference to FIGS. 2 and 3. FIG. 2 illustrates HWs present in 8-bit uncoded data, and FIG. 3 illustrates HWs present in 9-bit coded data encoded according to one embodiment of the present disclosure. Referring to FIG. 2, the HW histogram illustrates the distribution of HWs in the m-bit data (FIG. 1) to be encoded when m=8. In other words, 8-bit parallel data have HW distributions as shown in FIG. 2. Among the possible data patterns ($2^8$) of the 8-bit parallel data, there is 1 data pattern with HW=0, 8 data patterns with HW=1, 28 data patterns with HW=2, 56 data patterns with HW=3, 70 data patterns with HW=4, 56 data patterns with HW=5, 28 data patterns with HW=6, 8 data patterns with HW=7, and 1 data pattern with HW=8. The maximum possible variation in the HWs in the 8-bit data pattern is thus 8 (between HW=0 and HW=8), which results in a significant amount of SSN if they are transmitted uncoded. In addition, transmitting a data pattern with high HWs (such as HW=8 and HW=7) requires a lot of power (Vdd×Idd) drawn by drivers 108, 110 (FIG. 1).

Referring to FIG. 3, the HW histogram illustrates the distribution of HWs in the n-bit data (FIG. 1) that has been encoded according to embodiments of the present disclosure when n=9. The 8-bit data input to the encoder 106 is encoded to 9-bits using combinatorial logic (examples shown below) or an LUT, so that the encoded 9-bit data has enough data patterns to encode all 256 ($2^8$) possible 8-bit patterns for data Da but still results in the least amount of HW variation. As shown in FIG. 3, encoders 106, 112 use 4 data pattern with HW=3, 126 data patterns with HW=4, and 126 data patterns with HW=5. In other words, to encode the 8-bit input data Da, all of the 9-bit data patterns that have HW of 4 and 5 and four of the 9-bit data patterns that have HW of 3 are used. The total number of 9-bit data patterns used for the encoded data De is therefore 256 (4+126+126), the number required to express each of the 256 ($2^8$) possible patterns of input data Da.

By first using 9-bit data patterns that have HW of 4 and HW of 5, a large number (126+126) of data patterns are made available for encoding the 8-bit data, with small HW variation. This is a much more efficient choice than using other 9-bit data patterns with other HWs, for example, HW of 1, HW of 2, HW of 7, HW of 8, etc., because relatively small numbers of data patterns are available with these HWs (1, 2, 7, and 8) and thus a wide variation range of HWs would be required in the 9-bit encoded data pattern. After selecting the 9-bit data patterns that have HW 4 and HW 5, which provide 252 9-bit data patterns (126+126), the remaining 4 data patterns (out of 256 ($2^8$) 8-bit input data patterns) may be chosen from the 9-bit data patterns with HW of 3 or 6. Regardless of whether patterns with HW of 3 or HW of 6 are used, the HW variation range would be the same. For example, if HW 3 patterns are used with HW 4 and HW 5 data patterns, the HW variation range would be 2 (HW between 3 and 5). For another example, if data patterns with HW of 6 are used with data patterns with HW of 4 and HW of 5, the HW variation range would still be 2 (HW between 4 and 6). Nonetheless, encoders 106, 112 use data patterns with HW of 3, 4, and 5 (rather than 4, 5, and 6), because data patterns with HW of 3 have fewer logic level "1"s and thus consume less power in this embodiment. However, note that data patterns with HW of 6 may also be used in other embodiments. FIG. 3 shows the data patterns used for encoding the 8 bit data according to embodiments of the present disclosure in the histograms 302.

In addition to the 8-bit data input to the encoders 106, 112, additional auxiliary data 114 (such as commands) may also be encoded by the encoder 106. For example, Data Mask (DM) commands can be transmitted from the memory controller 102 to the memory device 104 as auxiliary data 114 to instruct memory device 104 to ignore the next encoded word on the parallel link 114 (no write operation). The 9-bit data patterns for use in encoding the auxiliary data 114 are also selected based on the same criteria, i.e., to minimize the HW variation range and supply power consumption in the encoded data while making available a sufficient number of data patterns for encoding the auxiliary data as well as the 8-bit input data. Thus, in the example shown in FIG. 3, additional data patterns 304 with HW of 3 are further selected to encode the auxiliary data 114. Other data patterns 306 with HWs of 0, 1, 2, 6, 7, 8, and 9, and some of the remaining data patterns 306 with HW of 3 are not used to encode the 8-bit data or the auxiliary data 114. As a result, the 9-bit encoded data has a minimum HW variation range (two HWs between HW 3 and HW 5) but still has a sufficient number of data patterns to encode 256 data patterns of the 8-bit input data. Since the variation in HW is minimized, the variation in supply current (Idd) from the Vdd power supply drawn by the drivers 108, 110 is also minimized.

In one embodiment, encoders 106, 112 use combinatorial logic gates to encode the m-bit input data Da into n-bit encoded data De. Table 1 below illustrates an example of combinatorial logic that may be used to encode 8-bit input data Da to 9-bit encoded data De according to embodiments of the present disclosure.

TABLE 1

| HW of Da | 8 Bit Uncoded Data ($x = x_7 x_6 x_5 x_4 x_3 x_2 x_1 x_0$) | 9-Bit Coded Data ($\bar{x}$ is complement of x) | Logic ("+" is OR operation) | HW of De |
|---|---|---|---|---|
| 0 | 0000 0000 | 1 0101 0000 | | 3 |
| 1 | $x_7 x_6 x_5 x_4$ 0000 | 1 1000 $\bar{x_7} \bar{x_6} \bar{x_5} \bar{x_4}$ | | 5 |
|   | 0000 $x_3 x_2 x_1 x_0$ | 1 0100 $\bar{x_3} \bar{x_2} \bar{x_1} \bar{x_0}$ | | 5 |
| 2 | 00 $x_5 x_4 x_3 x_2 x_1 x_0$ | 1 11 $x_5 x_4 x_3 x_2 x_1 x_0$ | $y_3 = x_5 + x_2 + x_0$ | 5 |
|   | 01 $x_5 x_4 x_3 x_2 x_1 x_0$ | 1 1010 $y_3 y_2 y_1 y_0$ | $y_2 = x_5 + x_4 + x_1$ | 5 |
|   | 10 $x_5 x_4 x_3 x_2 x_1 x_0$ | 1 1001 $y_3 y_2 y_1 y_0$ | $y_1 = x_4 + x_3 + x_0$ | 5 |
|   | 11 $x_5 x_4 x_3 x_2 x_1 x_0$ | 1 1001 0000 | $y_0 = x_3 + x_2 + x_1$ | 3 |
| 3 | $x_7 x_6 x_5 x_4 x_3 x_2 x_1 x_0$ | 1 $x_7 x_6 x_5 x_4 x_3 x_2 x_1 x_0$ | | 4 |

TABLE 1-continued

| HW of Da | 8 Bit Uncoded Data ($x = x_7 x_6 x_5 x_4 x_3 x_2 x_1 x_0$) | 9-Bit Coded Data ($\bar{x}$ is complement of x) | Logic ("+" is OR operation) | HW of De |
|---|---|---|---|---|
| 4 | $x_7 x_6 x_5 x_4 x_3 x_2 x_1 x_0$ | $0 x_7 x_6 x_5 x_4 x_3 x_2 x_1 x_0$ | | 4 |
| 5 | $x_7 x_6 x_5 x_4 x_3 x_2 x_1 x_0$ | $0 x_7 x_6 x_5 x_4 x_3 x_2 x_1 x_0$ | | 5 |
| 6 | $11 x_5 x_4 x_3 x_2 x_1 x_0$ | $1\ 00 x_5 x_4 x_3 x_2 x_1 x_0$ | $z_3 = \bar{x}_5 + \bar{x}_2 + \bar{x}_0$ | 5 |
| | $10 x_5 x_4 x_3 x_2 x_1 x_0$ | $1\ 0101\ z_3 z_2 z_1 z_0$ | $z_2 = \bar{x}_5 + \bar{x}_4 + \bar{x}_1$ | 5 |
| | $01 x_5 x_4 x_3 x_2 x_1 x_0$ | $1\ 0110\ z_3 z_2 z_1 z_0$ | $z_1 = \bar{x}_4 + \bar{x}_3 + \bar{x}_0$ | 5 |
| | $00 x_5 x_4 x_3 x_2 x_1 x_0$ | $1\ 0110\ 0000$ | $z_0 = \bar{x}_3 + \bar{x}_2 + \bar{x}_1$ | 3 |
| 7 | $x_7 x_6 x_5 x_4 1111$ | $1\ 0010\ x_7 x_6 x_5 x_4$ | | 5 |
| | $1111 x_3 x_2 x_1 x_0$ | $1\ 0001\ x_3 x_2 x_1 x_0$ | | 5 |
| 8 | 1111 1111 | 1 1010 0000 | | 3 |
| | Auxiliary Data (Extra Commands) | 1 1100 0000 | | 3 |
| | | 1 0110 0000 | | 3 |
| | | 1 0011 0000 | | 3 |
| | | 1 1001 0000 | | 3 |

Referring to Table 1 above, if the HW of the 8-bit input data is 3 (56 data patterns), the encoded 9-bit data is generated by appending "1" to the 8-bit data bits. If the HW of the 8-bit input data is 4 (70 data patterns) or 5 (56 data patterns), the encoded 9-bit data is generated by appending "0" to the 8-bit data bits. A total of 182 8-bit data patterns are encoded in this manner. The remaining 74 data patterns out of the 256 8-bit data patterns are divided into two groups. The first group is comprised of 70 data patterns and is encoded into 8-bit patterns with HW of 4 combined with a 9th bit of "1" to result in 9-bit encoded data patterns with HW of 5. The second group is comprised of four 8-bit data patterns and is encoded into 8-bit patterns with HW of 3 combined with a 9th bit of "0" to result in 9-bit encoded data patterns with HW of 3.

For example, as shown in Table 1, 8-bit data pattern in the form of 00000000 with HW of zero is encoded to the 9-bit encoded data pattern 101010000 with HW of 3. 8-bit data in the form of $x_7 x_6 x_5 x_4$ 0000 with HW of 1 are encoded into 9-bit data in the form of 11000 $\bar{x}_7 \bar{x}_6 \bar{x}_5 \bar{x}_4$ with HW of 5, and 8-bit data patterns in the form of 0000 $x_3 x_2 x_1 x_0$ with HW of one are encoded to the 9-bit encoded data patterns in the form of 10100 $\bar{x}_3 \bar{x}_2 \bar{x}_1 \bar{x}_0$ with HW of five, where $x_n$ is the n-th bit from a least significant bit of the 8-bit data pattern and $\bar{x}_n$ is the complement of $x_n$. 8-bit data patterns in the form of 00 $x_5 x_4 x_3 x_2 x_1 x_0$ with HW of two are encoded to the 9-bit encoded data patterns in the form of 111 $x_5 x_4 x_3 x_2 x_1 x_0$ with HW of five, 8-bit data patterns in the form of 01 $x_5 x_4 x_3 x_2 x_1 x_0$ with HW of two are encoded to the 9-bit encoded data patterns in the form of 11010 $y_3 y_2 y_1 y_0$ with HW of five, 8-bit data patterns in the form of 10 $x_5 x_4 x_3 x_2 x_1 x_0$ with HW of two are encoded to the 9-bit encoded data patterns in the form of 11001 $y_3 y_2 y_1 y_0$ with HW of five, and 8-bit data patterns in the form of 11 $x_5 x_4 x_3 x_2 x_1 x_0$ with HW of two are encoded to the 9-bit encoded data patterns 110010000 with HW of three, where $x_n$ is the n-th bit from a least significant bit of the 8-bit data pattern, $y_3=\bar{x}_5+\bar{x}_2+\bar{x}_0$, $y_2=\bar{x}_5+\bar{x}_4+\bar{x}_1$, $y_1=\bar{x}_4+\bar{x}_3+\bar{x}_0$, and $y_0=\bar{x}_3+\bar{x}_2+\bar{x}_1$ where + is OR operation.

For another example, 8-bit data patterns in the form of $x_7 x_6 x_5 x_4 x_3 x_2 x_1 x_0$ with HW of three are encoded to the 9-bit encoded data patterns in the form of 1 $x_7 x_6 x_5 x_4 x_3 x_2 x_1 x_0$ with HW of four, where $x_n$ is the n-th bit from a least significant bit of the 8-bit data pattern. 8-bit data patterns in the form of $x_7 x_6 x_5 x_4 x_3 x_2 x_1 x_0$ with HW of four are encoded to the 9-bit encoded data patterns 0 $x_7 x_6 x_5 x_4 x_3 x_2 x_1 x_0$ with HW of four, where $x_n$ is the n-th bit from a least significant bit of the 8-bit data pattern. 8-bit data patterns in the form of $x_7 x_6 x_5 x_4 x_3 x_2 x_1 x_0$ with HW of five are encoded to the 9-bit encoded data patterns in the form of 0 $x_7 x_6 x_5 x_4 x_3 x_2 x_1 x_0$ with HW of five, where $x_n$ is the n-th bit from a least significant bit of the 8-bit data pattern.

For still another example, 8-bit data patterns in the form of 11 $x_5 x_4 x_3 x_2 x_1 x_0$ with HW of six are encoded to the 9-bit encoded data patterns in the form of 100 $x_5 x_4 x_3 x_2 x_1 x_0$ with HW of five, 8-bit data patterns in the form of 10 $x_5 x_4 x_3 x_2 x_1 x_0$ with HW of six are encoded to the 9-bit encoded data patterns 10101 $z_3 z_2 z_1 z_0$ with HW of five, 8-bit data patterns in the form of 01 $x_5 x_4 x_3 x_2 x_1 x_0$ with HW of six are encoded to the 9-bit encoded data patterns 10110 $z_3 z_2 z_1 z_0$ with HW of five, and 8-bit data patterns in the form of 00 $x_5 x_4 x_3 x_2 x_1 x_0$ with HW of six are encoded to the 9-bit encoded data patterns 101100000 with HW of three, where $x_n$ is the n-th bit from a least significant bit of the 8-bit data pattern, $z_3=\bar{x}_5+\bar{x}_2+\bar{x}_0$, $z_2=\bar{x}_5+\bar{x}_4+\bar{x}_1$, $z_1=\bar{x}_4+\bar{x}_3+\bar{x}_0$, and $z_0=\bar{x}_3+\bar{x}_2+\bar{x}_1$, $\bar{x}_n$ is complement of $x_n$, and "+" is OR operation. 8-bit data patterns in the form of $x_7 x_6 x_5 x_4$ 1111 with HW of seven are encoded to the 9-bit encoded data patterns in the form of 10010 $x_7 x_6 x_5 x_4$ with HW of five, and 8-bit data patterns in the form of 1111 $x_3 x_2 x_1 x_0$ with HW of seven are encoded to the 9-bit encoded data patterns in the form of 10001 $x_3 x_2 x_1 x_0$ with HW of five, where $x_n$ is n-th bit from a least significant bit of the 8-bit data pattern. For still another example, 8-bit data pattern 11111111 with HW of eight is encoded to the 9-bit encoded data pattern 110100000 with HW of three.

Thus, as shown in Table 1, all the 9-bit encoded data have HW of 3, 4, or 5. As a result, the 256 of the 8-bit data patterns input to the encoders 106, 112 can be encoded into 9-bit data with HWs limited to 3, 4, or 5, and the HW variation range is merely 2 (between HW 3 and 5).

Furthermore, additional auxiliary data 114, 116 may also be encoded using the same methodology. The example of Table 1 earmarks four 9-bit codes to encode 4 different auxiliary data, i.e., "1 1100 0000," "1 0110 0000," "1 0011 0000," and "1 1001 0000." These additional 9-bit codes (see 304 in FIG. 3) are also selected from the 9-bit data patterns that have HW of 3 in this example.

In another embodiment, mappings between 8-bit uncoded data and 9-bit coded data may be predetermined using, for example, the combinatorial logic shown in Table 1, and stored in a LUT (not shown) on a memory device (not shown). That way, the encoding according the embodiments described herein may be performed rapidly. Also note that the encoders/decoder logic 106, 112 may also decode the 9-bit data patterns encoded according to the embodiments of the present disclosure simply by reversing the combinatorial logic shown in Table 1. For example, 9 bit data in the form of 1 $x_7 x_6 x_5 x_4 x_3 x_2 x_1 x_0$ with HW of 4 can be decoded to 8-bit data in the form of $x_7 x_6 x_5 x_4 x_3 x_2 x_1 x_0$ with HW of 3, and 9 bit data in the form of 1 1010 $y_3 y_2 y_1 y_0$ with HW of 5 can be decoded to 8-bit data in the form of 01 $x_5 x_4 x_3 x_2 x_1 x_0$ with HW of 2, and so on. In another embodiment, such reverse mappings may also be predetermined and stored in a LUT.

With the encoding technique in accordance with the embodiments described herein, SSN can be reduced significantly and AC current drawn from the power supply may also be reduced significantly compared to conventional encoding methods such as DBI used with single-ended parallel communication links. The encoding technique of the present disclosure may be used with conventional 9-bit parallel buses. Note that encoding and decoding of data may be performed between other numbers of bits than in the 8/9 bit encoding/decoding scheme as described herein.

Upon reading this disclosure, those of ordinary skill in the art will appreciate still additional alternative structural and functional designs for encoding data to reduce SSO noise, through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure disclosed herein without departing from the spirit and scope of the disclosure as defined in the appended claims.

What is claimed is:

1. A circuit, comprising:
encoder logic configured to receive $2^m$ m-bit data patterns and encode the $2^m$ m-bit data patterns to n-bit encoded data patterns, n being greater than m and m being a positive integer greater than one, wherein:
the encoder logic is configured to map the $2^m$ m-bit data patterns to a subset of less than $2^n$ of the n-bit encoded data patterns; and
the n-bit data patterns in said subset having a smallest possible range of Hamming Weight variation while a number of the n-bit data patterns in said subset being not less than $2^m$; and
a driver configured to transmit the n-bit encoded data patterns via a single-ended parallel communication link, wherein the n-bit encoded data patterns transmitted by the driver via the single-ended parallel communication link have the smallest possible range of Hamming Weight variation.

2. The circuit of claim 1, wherein the encoder logic comprises logic gates to map the $2^m$ of m-bit data patterns to the subset of $2^n$ of the n-bit encoded data patterns, with different ones of the logic gates being used to encode the m-bit data pattern depending upon a Hamming Weight in the m-bit data pattern to encode.

3. The circuit of claim 1, wherein the encoder logic comprises look-up tables mapping each of the $2^m$ m-bit data patterns to a corresponding one of the encoded n-bit data patterns.

4. The circuit of claim 1, further comprising decoder logic configured to map the subset of $2^n$ of the n-bit encoded data patterns back to the $2^m$ m-bit data patterns.

5. An encoder comprising:
encoder logic configured to receive $2^m$ m-bit data patterns and auxiliary data and to encode the $2^m$ m-bit data patterns and the auxiliary data to n-bit encoded data patterns, n being greater than m and m being a positive integer greater than one, wherein:
the encoder logic is configured to map the $2^m$ m-bit data patterns and auxiliary data to a subset of less than $2^n$ of the n-bit encoded data patterns; and
the n-bit encoded data patterns in said subset have a smallest possible range of Hamming Weight variation while a number of the n-bit encoded data patterns in said subset is not less than a sum of $2^m$ and a number of auxiliary patterns in the auxiliary data.

6. The encoder of claim 5, wherein the $2^m$ m-bit data patterns represent memory data and the auxiliary data represents memory commands.

7. A system comprising:
a first circuit including:
encoder logic configured to receive 8-bit data patterns and encode the 8-bit data patterns to 9-bit encoded data patterns,
the encoder logic being configured to map $2^8$ of the 8-bit data patterns to a subset of $2^8$ of the 9-bit encoded data patterns, and
the 9-bit data patterns in said subset having Hamming Weight variations of three Hamming Weights;
a second circuit; and
a 9-bit single-ended parallel communication link coupled between the first circuit and the second circuit and configured to transmit the 9-bit encoded data patterns between the first circuit and the second circuit over the parallel communication link, wherein the 9-bit encoded data patterns transmitted via the 9-bit single-ended parallel communication link have Hamming Weight variations of three Hamming Weights.

8. The system of claim 7, wherein said subset has encoded data patterns with Hamming Weights limited to three, four, and five.

9. The system of claim 7, wherein said subset has encoded data patterns with Hamming Weights limited to four, five, and six.

10. The system of claim 7, wherein the encoded logic comprises logic to map the $2^8$ 8-bit data patterns to the subset of the 9-bit encoded data patterns, different ones of the logic gates being used to encode the 8-bit data pattern depending upon a Hamming Weight in the 8-bit data pattern to encode.

11. The system of claim 7, wherein the encoder logic comprises look-up tables mapping each of the $2^8$ 8-bit data patterns to a corresponding data pattern in the subset of the 9-bit encoded data patterns.

12. The system of claim 7, wherein the encoder logic maps the 8-bit data pattern 00000000 with Hamming Weight of zero to the 9-bit encoded data pattern 101010000 with Hamming Weight of three.

13. The system of claim 7, wherein the encoder logic maps the 8-bit data patterns $x_7 x_6 x_5 x_4$ 0000 with Hamming Weight of one to the 9-bit encoded data patterns 11000 $\overline{x_7} \overline{x_6} \overline{x_5} \overline{x_4}$ with Hamming Weight of five, and maps the 8-bit data patterns 0000 $x_3 x_2 x_1 x_0$ with Hamming Weight of one to the 9-bit encoded data patterns 10100 $\overline{x_3} \overline{x_2} \overline{x_1} \overline{x_0}$ with Hamming Weight of five, where $x_n$ is n-th bit from a least significant bit of the 8-bit data pattern and $\overline{x_n}$ is complement of $x_n$.

14. The system of claim 7, wherein the encoder logic maps the 8-bit data patterns 00 $x_5 x_4 x_3 x_2 x_1 x_0$ with Hamming Weight of two to the 9-bit encoded data patterns 111 $x_5 x_4 x_3 x_2 x_1 x_0$ with Hamming Weight of five, maps the 8-bit data patterns 01 $x_5 x_4 x_3 x_2 x_1 x_0$ with Hamming Weight of two to the 9-bit encoded data patterns 11010 $y_3 y_2 y_1 y_0$ with Hamming Weight of five, maps the 8-bit data patterns 10 $x_5 x_4 x_3 x_2 x_1 x_0$ with Hamming Weight of two to the 9-bit encoded data patterns 11001 $y_3 y_2 y_1 y_0$ with Hamming Weight of five, and maps the 8-bit data patterns 11 $x_5$ $x_4$ $x_3$ $x_2$ $x_1$ $x_0$ with Hamming Weight of two to the 9-bit encoded data patterns 110010000 with Hamming Weight of three, where $x_n$ is n-th bit from a least significant bit of the 8-bit data pattern, $y_3=x_5+x_0$, $y_2=x_5+x_4+x_1$, $y_1=x_4+x_3+x_0$, and $y_0=x_3+x_2+x_1$ where +is OR operation.

15. The system of claim 7, wherein the encoder logic maps the 8-bit data patterns $x_7$ $x_6$ $x_5$ $x_4$ $x_3$ $x_2$ $x_1$ $x_0$ with Hamming Weight of three to the 9-bit encoded data patterns 1 $x_7$ $x_6$ $x_5$ $x_4$ $x_3$ $x_2$ $x_1$ $x_0$ with Hamming Weight of four, where $x_n$ is n-th bit from a least significant bit of the 8-bit data pattern.

16. The system of claim 7, wherein the encoder logic maps the 8-bit data patterns $x_7 x_6 x_5 x_4 x_3$ $x_2$ $x_1$ $x_0$ with Hamming Weight of four to the 9-bit encoded data patterns 0 $x_7 x_6 x_5 x_4 x_3$ $x_2$ $x_1$ $x_0$ with Hamming Weight of four, where $x_n$ is n-th bit from a least significant bit of the 8-bit data pattern.

17. The system of claim 7, wherein the encoder logic maps the 8-bit data patterns $x_7 x_6 x_5 x_4 x_3$ $x_2$ $x_1$ $x_0$ with Hamming Weight of five to the 9-bit encoded data patterns 0 $x_7 x_6 x_5 x_4 x_3$ $x_2$ $x_1$ $x_0$ with Hamming Weight of five, where $x_n$ is n-th bit from a least significant bit of the 8-bit data pattern.

18. The system of claim 7, wherein the encoder logic maps the 8-bit data patterns 11 $x_5 x_4 x_3 x_2 x_1 x_0$ with Hamming Weight of six to the 9-bit encoded data patterns 100 $x_5 x_4 x_3 x_2 x_1 x_0$ with Hamming Weight of five, maps the 8-bit data patterns 10 $x_5 x_4 x_3 x_2 x_1 x_0$ with Hamming Weight of six to the 9-bit encoded data patterns 10101 $z_3 z_2 z_1 z_0$ with Hamming Weight of five, maps the 8-bit data patterns 01 $x_5 x_4 x_3 x_2 x_1 x_0$ with Hamming Weight of six to the 9-bit encoded data patterns 10110 $z_3 z_2 Z_1 z_0$ with Hamming Weight of five, and maps the 8-bit data patterns 00 $x_5 x_4 x_3$ $x_2 x_1 x_0$ with Hamming Weight of six to the 9-bit encoded data patterns 101100000 with Hamming Weight of three, where $x_n$ is n-th bit from a least significant bit of the 8-bit data pattern, $z_3=\overline{x_5}+\overline{x_2}+\overline{x_0}$, $z_2=\overline{x_5}+\overline{x_4}+\overline{x_1}$, $z_1=\overline{x_4}+\overline{x_3}+\overline{x_0}=\overline{x_3}+\overline{x_2}+\overline{x_1}$, $\overline{x_n}$ is complement of $x_n$, and + is OR operation.

19. The system of claim 7, wherein the encoder logic maps the 8-bit data patterns $x_7 x_6 x_5 x_4$ 1111 with Hamming Weight of seven to the 9-bit encoded data patterns 10010 $x_7 x_6 x_5 x_4$ with Hamming Weight of five, and maps the 8-bit data patterns 1111 $x_3 x_2 x_1 x_0$ with Hamming Weight of seven to the 9-bit encoded data patterns 10001 $x_3 x_2 x_1 x_0$ with Hamming Weight of five, where $x_n$ is n-th bit from a least significant bit of the 8-bit data pattern.

20. The system of claim 7, wherein the encoder logic maps the 8-bit data pattern 11111111 with Hamming Weight of eight to the 9-bit encode data pattern 110100000 with Hamming Weight of three.

21. The system of claim 7, wherein the encoder logic is configured to also receive and encode auxiliary data, and the 9-bit data patterns in said subset has a smallest possible range of Hamming Weight variation while the number of the 9-bit data patterns in said subset being not less than a sum of $2^8$ and number of data patterns in the auxiliary data, and the encoder logic maps the 8-bit auxiliary data to the 9-bit encoded data pattern 111000000, 101100000, 100110000, or 110010000 with Hamming Weight of three.

22. The system of claim 7, wherein the encoder logic comprises look-up tables mapping each of the $2^8$ 8-bit data patterns to a corresponding data pattern in the subset of the 9-bit encoded data patterns.

23. The system of claim 7, further comprising decoder logic configured to map the 9-bit encoded data patterns back to the $2^8$ 8-bit data patterns.

24. The system of claim 7, wherein the first circuit is a memory controller and the second circuit is a memory device.

25. A method of encoding data for transmission on a parallel single-ended communication link, the method comprising:
receiving m-bit data patterns; and
encoding the m-bit data patterns to n-bit encoded data patterns, n being greater than m and m being a positive integer greater than one, wherein:
each of the $2^m$ m-bit data patterns is mapped to one of the n-bit encoded data patterns in a subset of the n-bit encoded data patterns; and
the n-bit encoded data patterns in said subset have a smallest possible range of Hamming Weight variation while a number of the n-bit data patterns in said subset is not less than $2^m$; and
transmitting the n-bit encoded data patterns via the parallel single-ended communication link, wherein the n-bit encoded data patterns transmitted via the parallel single-ended communication link have the smallest possible range of Hamming Weight variation.

26. A method of encoding data, the method comprising:
receiving m-bit data patterns;
receiving auxiliary data
encoding the m-bit data patterns and auxiliary data to n-bit encoded data patterns, n being greater than m and m being a positive integer greater than one,
wherein:
each of the $2^m$ m-bit data patterns is mapped to one of the n-bit encoded data patterns in a subset of the n-bit encoded data patterns; and
the n-bit encoded data patterns in said subset having a smallest possible range of Hamming Weight variation while a number of the n-bit encoded data patterns in said subset being not less than a sum of $2^m$ and a number of data patterns in the auxiliary data.

* * * * *